US008889981B2

(12) United States Patent
Lee et al.

(10) Patent No.: US 8,889,981 B2
(45) Date of Patent: Nov. 18, 2014

(54) PHOTOELECTRIC DEVICE

(75) Inventors: Doo-Youl Lee, Yongin-si (KR);
Young-Jin Kim, Yongin-si (KR);
Dong-Seop Kim, Yongin-si (KR);
Chan-Bin Mo, Yongin-si (KR);
Young-Su Kim, Yongin-si (KR);
Young-Sang Park, Yongin-si (KR)

(73) Assignee: Samsung SDI Co., Ltd., Yongin-Si, Gyeonggi-Do (KR)

( * ) Notice: Subject to any disclaimer, the term of this patent is extended or adjusted under 35 U.S.C. 154(b) by 59 days.

(21) Appl. No.: 13/424,450

(22) Filed: Mar. 20, 2012

(65) Prior Publication Data
US 2013/0092224 A1    Apr. 18, 2013

Related U.S. Application Data

(60) Provisional application No. 61/548,401, filed on Oct. 18, 2011.

(51) Int. Cl.
H01L 31/00       (2006.01)
H01L 31/0224    (2006.01)
H01L 31/0352    (2006.01)
H01L 31/075     (2012.01)
H01L 31/0747    (2012.01)

(52) U.S. Cl.
CPC .... H01L 31/022441 (2013.01); H01L 31/0352 (2013.01); H01L 31/075 (2013.01); H01L 31/0747 (2013.01); Y02E 10/548 (2013.01); Y02E 10/547 (2013.01)
USPC ........................................................ 136/256

(58) Field of Classification Search
USPC ........................................................ 136/256
See application file for complete search history.

(56) References Cited

U.S. PATENT DOCUMENTS

| 7,468,485 | B1 | 12/2008 | Swanson |
| 7,633,006 | B1 | 12/2009 | Swanson |
| 2006/0130891 | A1* | 6/2006 | Carlson .......................... 136/256 |
| 2007/0169808 | A1 | 7/2007 | Kherani et al. |
| 2008/0035198 | A1 | 2/2008 | Teppe et al. |
| 2009/0308457 | A1* | 12/2009 | Smith ............................ 136/261 |
| 2010/0108130 | A1 | 5/2010 | Ravi |
| 2010/0193027 | A1 | 8/2010 | Ji et al. |
| 2010/0200058 | A1 | 8/2010 | Funakoshi |

FOREIGN PATENT DOCUMENTS

| JP | 2009-88145 | 4/2009 |
| JP | 2009-200267 | 9/2009 |
| JP | 2010-177655 | 8/2010 |
| JP | 2010-283406 | 12/2010 |
| JP | 2011-009733 | 1/2011 |
| KR | 10-2007-0092953 | 7/2007 |
| KR | 10-2009-0050334 A | 5/2009 |
| KR | 10-2010-0006950 A | 1/2010 |

(Continued)

*Primary Examiner* — Jonathan Johnson
*Assistant Examiner* — Angelo Trivisonno
(74) *Attorney, Agent, or Firm* — Lee & Morse, P.C.

(57) ABSTRACT

A photoelectric device includes a first semiconductor structure and a second semiconductor structure on a substrate, and the first semiconductor structure includes a different conductivity type from the second semiconductor structure. The photoelectric device also includes a first electrode on the first semiconductor structure and a second electrode on the second semiconductor structure, and an interlayer insulating structure adjacent to the second semiconductor structure. The interlayer insulating structure separates the first semiconductor structure from the second semiconductor structure and separates the first semiconductor structure from the second electrode.

19 Claims, 14 Drawing Sheets

(56) References Cited

FOREIGN PATENT DOCUMENTS

| KR | 10-2010-0057459 A | 5/2010 |
| KR | 10-2010-0136462 A | 12/2010 |
| KR | 10-2011-0010336 A | 2/2011 |

* cited by examiner

PHOTOELECTRIC DEVICE

CROSS-REFERENCE TO RELATED APPLICATION

The present application claims priority under 35 U.S.C. §119(e) to U.S. Provisional Application No. 61/548,401, filed on Oct. 18, 2011, in the United States Patent and Trademark Office, and entitled "Photoelectric Device," which is incorporated herein by reference in its entirety.

BACKGROUND

Development of clean energy sources has been accelerated. An exemplary clean energy source includes photovoltaic energy generated using solar cells, in which sunlight is transformed into energy. However, costs for generating photovoltaic energy that is currently industrially generated by using solar cells may be high in comparison to generation of thermal energy.

SUMMARY

Embodiments may be realized by providing a photoelectric device that includes a first semiconductor structure and a second semiconductor structure on a substrate, the first semiconductor structure includes a different conductivity type from the second semiconductor structure, a first electrode on the first semiconductor structure and a second electrode on the second semiconductor structure, and an interlayer insulating structure adjacent to the second semiconductor structure. The interlayer insulating structure separates the first semiconductor structure from the second semiconductor structure and separates the first semiconductor structure from the second electrode.

The first semiconductor structure may have a first region with a first area and the second semiconductor structure may have a second region with a second area. The first area of the first region may be substantially greater than the second area of the second region. The second semiconductor structure may have an island shape such that the second semiconductor structure is surrounded by the first semiconductor structure.

The first electrode and the second electrode may have substantially a same width. The second electrode may overlap the first semiconductor structure and the second semiconductor structure. The interlayer insulating structure may include a through hole. The second electrode may be connected to the second semiconductor structure via the through hole.

The interlayer insulating structure may include a first portion. The first portion may be between the first semiconductor structure and the second semiconductor structure on the substrate. The first portion of the interlayer insulating structure may surround the second semiconductor structure. The first portion of the interlayer insulating structure may entirely surround the second semiconductor structure.

The interlayer insulating structure may include a second portion on the first semiconductor structure such that the second portion is between the second electrode and the first semiconductor structure. The first and second portions of the interlayer insulating structure may be integrally formed as one piece. A width of the second portion of the interlayer insulating structure along a first direction may be greater than a width of the second electrode along the first direction. The first direction may be a direction extending between the first and second electrodes.

The photoelectric device may include a gap insulating layer, and the gap insulating layer may surround the second semiconductor structure and the interlayer insulating structure on the gap insulating layer. An upper surface of the first electrode may be at a first distance from the substrate and an upper surface of the second electrode may be at a second distance from the substrate. The second distance may be greater than the first distance.

The interlayer insulating structure and the first electrode may be arranged along a horizontal line extending in a direction between the interlayer insulating structure and the first electrode. The photoelectric device may include a passivation layer on the substrate. The passivation layer may be on a side of the substrate opposite the first and second semiconductor structures. The photoelectric device may include an antireflection layer on the passivation layer.

The first semiconductor structure may include a first intrinsic layer on the substrate, a first conductive semiconductor layer on the first intrinsic layer, and a first transparent conductive layer on the first intrinsic layer and the first conductive semiconductor layer. The first transparent conductive layer may cover lateral sides of the first intrinsic layer and the first conductive semiconductor layer and may cover an upper surface of the first conductive semiconductor layer.

The second semiconductor structure may include a second intrinsic layer on the structure, a second conductive semiconductor layer on the second intrinsic layer, and a second transparent conductive layer on the second intrinsic layer and the second conductive semiconductor layer. The first conductive semiconductor layer may have the different conductivity type from the second conductive semiconductor layer. The second transparent conductive layer may cover lateral sides of the second intrinsic layer and the second conductive semiconductor layer and may cover an upper surface of the second conductive semiconductor layer.

Embodiments may also be realized by providing a method of manufacturing a photoelectric device that includes forming a first semiconductor structure on a substrate, forming a second semiconductor structure in a region that excludes the first semiconductor structure, the first semiconductor structure includes a different conductivity type from the second semiconductor structure, forming an interlayer insulating structure on the second semiconductor structure such that the interlayer insulating structure separates the first semiconductor structure from the second semiconductor structure, and forming a first electrode on the first semiconductor structure and forming a second electrode on the second semiconductor structure such that the second electrode is separated from the first semiconductor structure by the interlayer insulating structure.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
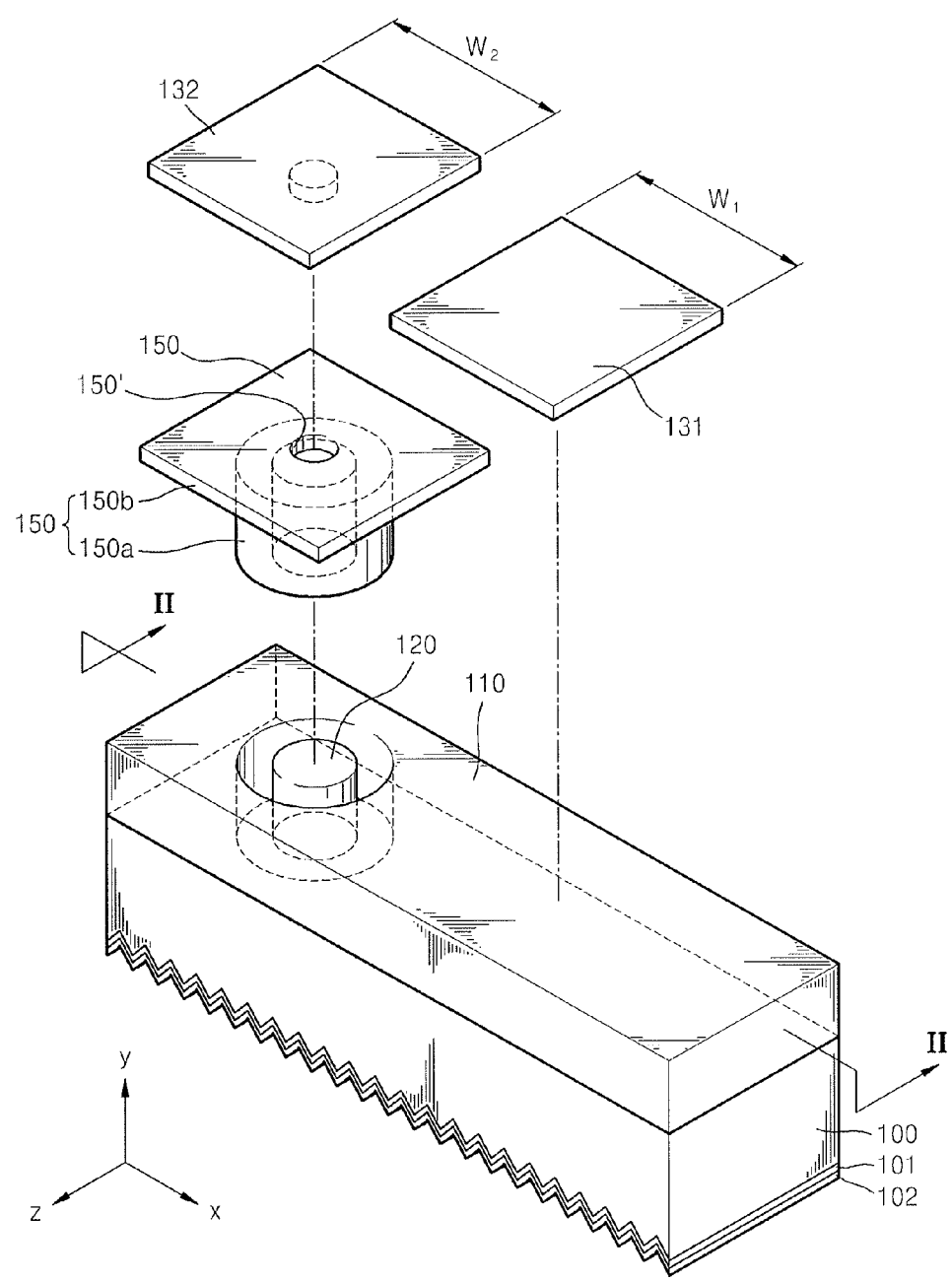
FIG. 1 illustrates a schematic perspective view of a photoelectric device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
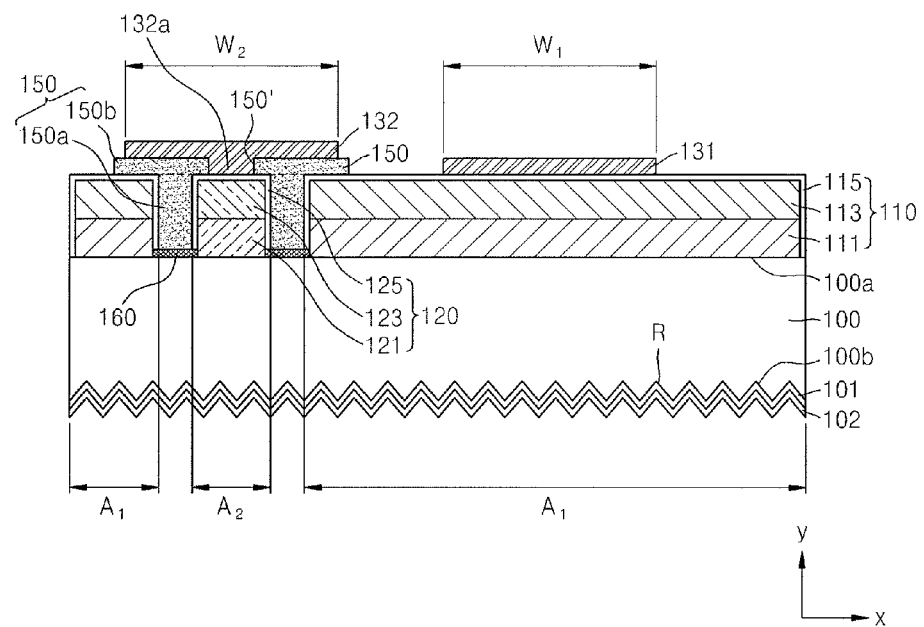
FIG. 2 illustrates a cross-sectional view of the photoelectric device taken along a line II-II of FIG. 1.

FIG. 1 illustrates a schematic perspective view of a photoelectric device according to an exemplary embodiment. FIG. 2 illustrates a cross-sectional view of the photoelectric device taken along a line II-II of FIG. 1.

Referring to FIGS. 1 and 2, the photoelectric device may include a semiconductor substrate 100, a first semiconductor structure 110 having a first conductive type, and a second semiconductor structure 120 having a second conductive type. At least one first semiconductor structure 110 and a plurality of second semiconductor structures 120 may be formed on the semiconductor substrate 100. The photoelectric device may also include first and second electrodes 131 and 132 that are electrically connected to the first semiconductor structure 110 and the second semiconductor structure 120, respectively. An interlayer insulating layer 150 may be disposed between the second electrode 132 and the first semiconductor structure 110.

According to an exemplary embodiment, the first semiconductor structure 110 may be formed in a relatively wide region and may surround the second semiconductor structure 120. The second semiconductor structure 120 may have a dot or island type. For example, the plurality of the second semiconductor structures 120 may be spaced apart on the semiconductor substrate 100 and the first semiconductor structures 110 may be arranged in the space between and surrounding the second semiconductor structures 120.

The first semiconductor structures 110 may have a different, e.g., an opposite, conductivity type from the second semiconductor structures 120. The first semiconductor structure 110 may be spatially spaced apart from an adjacent second semiconductor structure 120 and may be electrically insulated from each other. For example, the first semiconductor structure 110 may be insulated from the adjacent second semiconductor 120 by the interlayer insulating layer 150 extending between the first and second semiconductor structures 110 and 120. The interlayer insulating layer 150 may reduce the possibility of and/or prevent an electrical short circuit between the first semiconductor structure 110 and the second electrode 132 connected to the second semiconductor structure 120 having a conductive type different from that of the first semiconductor structure 110.

The interlayer insulating layer 150 may include a first portion 150a and a second portion 150b. The first portion 150a may extend in one direction, e.g., in the y-axis direction, between the first and second semiconductor structures 110 and 120. For example, the first portion 150a may extend in a direction defining a boundary between the first and second semiconductor structures 110 and 120. The first portion 150a may be buried between the first and second semiconductor structures 110 and 120. The second portion 150b may extend in another direction, e.g., in the z-axis direction, so as to overlap the first portion 150a and to overlap an upper surface of at least the first semiconductor structure 110. The second portion 150b may include a via hole 150', e.g., a through hole, that overlaps an upper surface of the second semiconductor structure 120. The second portion 150b may include a part, which surrounds the via hole 150', that overlaps a portion of the upper surface of the second semiconductor structure 120. For example, the via hole 150' may overlap the entire second semiconductor structure 120 or may overlap a part of the second semiconductor structure 120.

The semiconductor substrate 100 may have a first surface 100a and a second surface 100b opposite to the first surface 100a, e.g., as illustrated in FIG. 2. For example, a back-contact in which the first and second electrodes 131 and 132 of an emitter and a base are formed may be formed on the first surface 100a. The second surface 100b may exclude an electrode structure and may be a light receiving surface. The second surface 100b may increase effective incident light and reduce light loss. For example, a back-contact in which no electrode is formed may be on the second surface 100b functioning as the light receiving surface of the semiconductor substrate 100, thereby reducing light loss, and obtaining a high output compared to the conventional solar cell in which an electrode is formed on the second surface 100b functioning as the light receiving surface.

For example, the semiconductor substrate 100 may generate carriers through light received by the second surface 100b. Carriers generated by light (hereinafter referred to as "carriers") mean holes and electrons generated when light is absorbed into the semiconductor substrate 100. The semiconductor substrate 100 may be formed as, e.g., a single crystal or poly crystal silicon substrate having an n- or p-conductive type. For example, according to an exemplary embodiment, the semiconductor substrate 100 may be formed as a p-type single crystal silicon substrate.

A texture structure R including a roughness pattern may be formed on the second surface 100b of the semiconductor substrate 100. The roughness surface may include a plurality of minute protrusions. The texture structure R may, e.g., reduce reflectance of incident light.

A passivation layer 101 may be formed on the second surface 100b of the semiconductor substrate 100. The passivation layer 101 may cover the roughness surface R of the semiconductor substrate 100 so that, e.g., the passivation layer 101 may be curved. The passivation layer 101 may, e.g., suppress surface recombination of carriers generated by the semiconductor substrate 100 and thus may improve carrier collection efficiency. For example, the passivation layer 101 may improve carrier collection efficiency by reducing surface recombination of carriers due to a defective of the surface of the semiconductor substrate 100.

According to an exemplary embodiment, the passivation layer 101 may include, e.g., at least one of an intrinsic semiconductor layer, a doped semiconductor layer, a silicon oxide layer (SiOx), and a silicon nitride layer (SiNx). The intrinsic semiconductor layer and the doped semiconductor layer may be formed of, e.g., amorphous silicon deposited on the semiconductor substrate 100. For example, the passivation layer 101 may be formed of amorphous silicon (a-Si) doped in the same conductive type as that of the semiconductor substrate 100, and may be doped at a higher density than the semiconductor substrate 100. Accordingly, the passivation layer 101 may form a surface field for suppressing surface recombination of carriers.

An antireflective layer 102 may be formed on the passivation layer 101. The antireflective layer 102 may cover the roughness surface R of the semiconductor substrate 100 so that, e.g., the antireflective layer 102 may be curved. The antireflective layer 102 may include, e.g., at least one of the silicon oxide layer (SiOx) and the silicon nitride layer (SiNx). For example, the antireflective layer 102 may be formed as a single layer of the silicon oxide layer (SiOx) or a combination layer of the silicon oxide layer (SiOx) and the silicon nitride layer (SiNx) having different refractive indexes.

Although the passivation layer 101 and the antireflective layer 102 may have separate layer structures according to an exemplary embodiment, the passivation layer 101 and the antireflective layer 102 may have structures of a single layer according to another exemplary embodiment. For example, a hydrogenated silicon nitride (SiN:H) layer may be formed on, e.g., directly on, the roughness surface R of the semiconductor substrate 100 to obtain passivation and antireflection effects.

The first and second semiconductor structures 110 and 120 having opposite conductive types may be formed on the first surface 100a of the semiconductor substrate 100. The first and second semiconductor structures 110 and 120 may include the emitter and the base that separate and collect the carriers generated by the semiconductor substrate 100.

The first semiconductor structure 110 may include a first intrinsic semiconductor layer 111 and a first conductive semiconductor layer 113 stacked. e.g., sequentially stacked, on the semiconductor substrate 100. According to an exemplary embodiment, the first intrinsic semiconductor layer 111 and/ or the first conductive semiconductor layer 113 may include one of amorphous silicon (a-Si) and micro crystalline silicon (μc-Si).

The first intrinsic semiconductor layer 111 may be formed by, e.g., not adding a dopant or by adding a small amount of dopants. The small amount of dopant may be a p- or n-type dopant. For example, the first intrinsic semiconductor layer 111 may passivate the surface of the semiconductor substrate 100 to, e.g., suppress recombination of the carriers generated by the semiconductor substrate 100 and/or to enhance the interface characteristics between the semiconductor substrate and the first conductive semiconductor layer 113. According to an exemplary embodiment, the semiconductor substrate 100 may be formed of crystalline silicon and the first conductive semiconductor layer 113 may be formed of amorphous silicon, and the first intrinsic semiconductor layer 11 may enhance the interface characteristics therebetween.

The first conductive semiconductor layer 113 may be formed by adding a p- or n-type dopant. The doping concentration in the first conductive semiconductor layer 113 may be greater than a doping concentration, if there is a doping concentration, of the first intrinsic semiconductor layer 111. For example, the first conductive semiconductor layer 113 may be doped in a p-conductive type different from, e.g., inverse to, that of the semiconductor substrate 100 having the n-conductive type. When there is a doping concentration in the first intrinsic semiconductor layer 111, the conductivity type of the dopant therein may be the same as the conductivity type of the dopant in the first conductive semiconductor layer 113. Further, the first conductive semiconductor layer 113 may form the emitter of collecting minority carriers (e.g. holes) from the semiconductor substrate 100 having, e.g., the n-conductive type.

The first semiconductor structure 110 may include a first transparent conductive layer 115 formed on the first conductive semiconductor layer 113. The first transparent conductive layer 115 may be formed of, e.g., an electrically conductive and optically transparent material. For example, the first transparent conductive layer 115 may be formed of a transparent conducting oxide (TCO) such as indium tin oxide (ITO), zinc oxide (ZnO), etc.

According to an exemplary embodiment, the first transparent conductive layer 115 may be formed along external surfaces of the first conductive semiconductor layer 113 and the first intrinsic semiconductor layer 111. For example, the first transparent conductive layer 115 may cover, e.g., completely cover, exposed sides of the first conductive semiconductor layer 113 and the first intrinsic semiconductor layer 111. The first transparent conductive layer 115 may form an electrical contact in a wide region, thereby reducing a contact resistance and mediating a connection between the first semiconductor structure 110 and the first electrode 131.

The second semiconductor structure 120 may include a second intrinsic semiconductor layer 121 and a second conductive semiconductor layer 123 stacked, e.g., sequentially stacked, on the semiconductor substrate 100. The second intrinsic semiconductor layer 121 and/or the second conductive semiconductor layer 123 may include one of amorphous silicon (a-Si) and micro crystalline silicon (μc-Si). The second intrinsic semiconductor layer 121 may include the same material as the first intrinsic semiconductor layer 111, and may differ by shape, size, and/or type of dopant (if a dopant is included). The second conductive semiconductor layer 123 may include the same material as the first conductive semiconductor layer 113, and may differ by shape, size, and/or type of dopant.

The second intrinsic semiconductor layer 121 may be formed by, e.g., not adding a dopant or by adding a small amount of dopants. The small amount of dopant may be a p- or n-type dopant. For example, the second intrinsic semiconductor layer 121 may passivate the surface of the semiconductor substrate 100 to, e.g., suppress recombination of the carriers generated by the semiconductor substrate 100 and/or to enhance the interface characteristics between the semiconductor substrate 100 formed of a material such as crystalline silicon and the second conductive semiconductor layer 123 formed of a material such as amorphous silicon.

The second conductive semiconductor layer 123 may be formed by adding a p- or n-type dopant. The doping concentration in the second conductive semiconductor layer 123 may be greater than a doping concentration, if there is a doping concentration, of the second intrinsic semiconductor layer 121. For example, the second conductive semiconductor layer 123 may be doped in an n-conductive type that is the same as that of the semiconductor substrate 100 having the n-conductive type. When there is a doping concentration in the second intrinsic semiconductor layer 121, the conductivity type of the dopant therein may be the same as the conductivity type of the dopant in the second conductive semiconductor layer 123. Further, the second conductive semiconductor layer 123 may form the base of collecting a plurality of carriers (e.g. electrons) from the semiconductor substrate 100 having, e.g., the n-conductive type.

The second semiconductor structure 120 may include a second transparent conductive layer 125 formed on the second conductive semiconductor layer 123. The second transparent conductive layer 125 may be formed of, e.g., an electrically conductive and optically transparent material. For example, the second transparent conductive layer 125 may be formed of a transparent conducting oxide (TCO) such as indium tin oxide (ITO), zinc oxide (ZnO), etc.

According to an exemplary embodiment, the second transparent conductive layer 125 may be formed along external surfaces of the second conductive semiconductor layer 123 and the second intrinsic semiconductor layer 121. For example, the second transparent conductive layer 125 may cover, e.g., completely cover, lateral sides of the second conductive semiconductor layer 123 and the second intrinsic semiconductor layer 121. The second transparent conductive layer 125 may form an electrical contact in a wide region, thereby reducing a contact resistance and mediating a connection between the second semiconductor structure 120 and the second electrode 132.

Although the first and second semiconductor structures 110 and 120 are singular in FIG. 1, the first and second semiconductor structures 110 and 120 may be plural on the first surface 100a of the semiconductor substrate 100.

Although the first and second semiconductor structures 110 and 120 that form the emitter and the base include the first and second intrinsic semiconductor layers 111 and 121 and the first and second conductive semiconductor layers 113 and 123 in FIG. 2, embodiments are not limited thereto. For example, the first and second semiconductor structures 110 and 120 may be reversed in that the first semiconductor structures 110 may not include the first and second intrinsic semiconductor layers 111 and 121 and may include the first and second conductive semiconductor layers 113 and 123 according to another exemplary embodiment.

Although the first and second semiconductor structures 110 and 120 include the first and second transparent conductive layers 115 and 125 that, e.g., mediate an electrical connection between the first and second electrodes 131 and 132 in FIG. 2, the first and second semiconductor structures 110 and 120 may not include the first and second transparent conductive layers 115 and 125. For example, the first and second semiconductor structures 110 and 120 may include the first and second electrodes 131 and 132 on the first and second semiconductor structures 110 and 120 excluding the first and second transparent conductive layers 115 and 125 according to another exemplary embodiment.

First and second semiconductor regions A1 and A2 in which the first and second semiconductor structures 110 and 120, respectively, are arranged on the semiconductor substrate 100 may have different areas. For example, the first semiconductor region A1 including the first semiconductor structure 110, e.g., the emitter of collecting minority carriers, may have a relatively increased structure and/or substantially greater area to, e.g., increase collection efficiency of minority carriers.

Figure 3A:
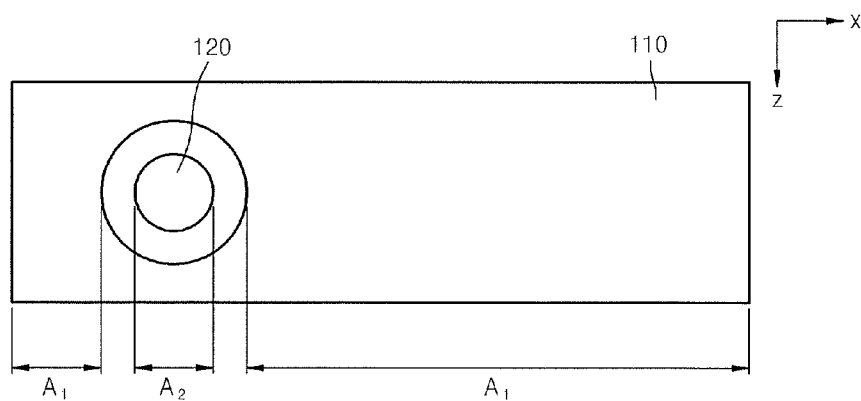
FIG. 3A illustrates a schematic plan view of an exemplary arrangement relationship between first and second semiconductor structures.

FIG. 3A illustrates a schematic plan view of an arrangement relationship between first and second semiconductor structures 110 and 120. Referring to FIG. 3A, the first and second semiconductor structures 110 and 120 may have different areas that may be formed on the semiconductor substrate 100. For example, the first semiconductor structure 110, which may collect minority carriers of the semiconductor substrate 100, may have a relatively wide area. Accordingly, collection efficiency of carriers may be enhanced in the first semiconductor structure 110. The second semiconductor structure 120, which may collect majority carriers of the semiconductor substrate 100, may have a relatively narrow area. Accordingly, collection efficiency of carriers may not be deteriorated.

In other words, when comparing the areas of the first and second semiconductor regions A1 and A2 in which the first and second semiconductor structures 110 and 120 are projected on the semiconductor substrate 100, the area of the first semiconductor region A1 may be substantially greater and/or relatively wider than the area of the second semiconductor region A2. For example, the second semiconductor structure 120 may be formed having a dot or island type, and the first semiconductor structure 110 may surround the second semiconductor structure 120.

According to an exemplary embodiment, the second semiconductor structure 120 may be formed having an isolation type, and the first semiconductor structure 110 may be formed in a large area surrounding the second semiconductor structure 120 having the isolation type. Accordingly, the area of the first semiconductor structure 110 may be relatively increased and collection efficiency of carriers generated by light may be enhanced. That is, the second semiconductor structure 120 may have the isolation type to increase the area of the first semiconductor structure 110 on the semiconductor substrate 110 of a limited area, and the first semiconductor structure 110 of the large area surrounding the second semiconductor structure 120 may be formed.

Figure 3B:
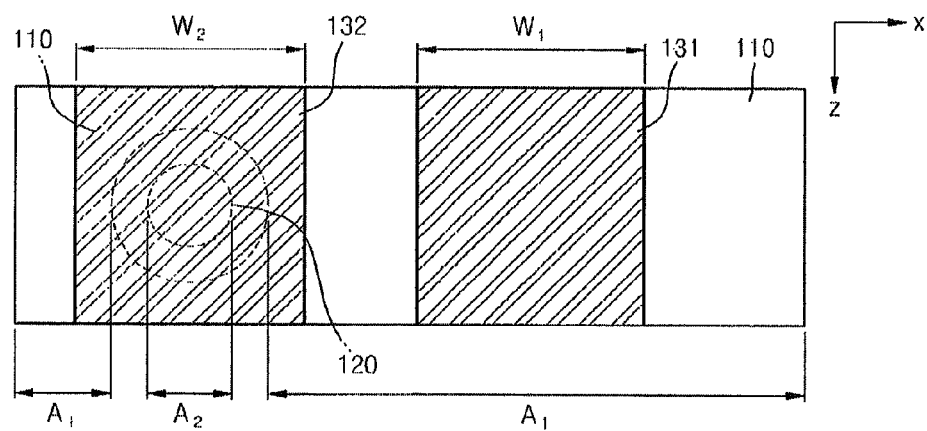
FIG. 3B illustrates a schematic plan view of an exemplary arrangement relationship between first and second semiconductor structures and first and second electrodes.
Figure 3C:
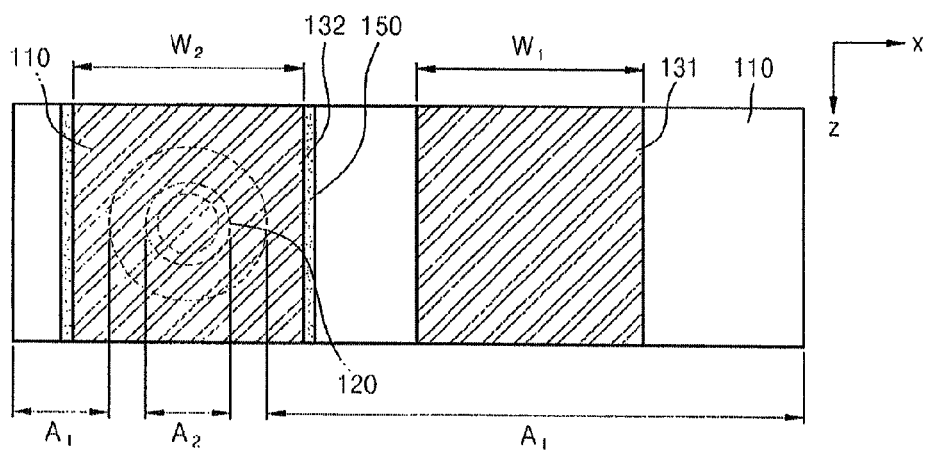
FIG. 3C illustrates a schematic plan view of an exemplary arrangement of an interlayer insulating layer.

FIG. 3B illustrates a schematic plan view of an arrangement relationship between the first and second semiconductor structures 110 and 120 and the first and second electrodes 131 and 132. Referring to FIG. 3B, the first and second electrodes 131 and 132 may be formed on the semiconductor substrate 100. The first electrode 131 may be formed on the first semiconductor structure 110. The second electrode 132 may be formed on the first and second semiconductor structures 110 and 120. The first and second electrodes 131 and 132 may be connected to the first and second semiconductor structures 110 and 120, respectively, and carriers generated by light may be withdrawn to the outside.

The first and second electrodes 131 and 132 may be formed of, e.g., a metallic material such as silver (Ag), aluminum (Al), copper (Cu), nickel (Ni), etc. Although the first second electrodes 131 and 132 may have wide shapes in a width direction, e.g., the x-axis direction, in FIG. 1 for understanding convenience and embodiments are not limited thereto. For example, the first and second electrodes 131 and 132 may be formed in a stripe pattern in a current withdrawal direction, e.g., the z-axis direction.

The first and second electrodes 131 and 132 may provide photocurrent paths, and have substantially the same or similar electrode area, e.g., to reduce a serial resistance of the photocurrent paths. For example, if one of the first and second electrodes 131 and 132 were to have a relatively narrow area, the first and second electrodes 131 and 132 having narrow areas may limit conductivity of photocurrent paths. Therefore, according to an exemplary embodiment, the first and second electrodes 131 and 132 may be uniformly designed to have equal areas while the area of the first semiconductor structure 110 may be greater than the area of the second semiconductor structure 120. Accordingly, the serial resistance of photocurrent paths may be reduced.

Referring to FIG. 3B, line widths W1 and W2 of the first and second electrodes 131 and 132, respectively, may be designed to be uniform, e.g., equal in length and width, and may be substantially the same as each other. The line widths W1 and W2 may be measured in a direction extending between the adjacent first and second electrodes 131 and 132. Since the first electrode 131 and the second electrode 132 may be uniform, the second electrode 132 may be wider than the second semiconductor structure 120 that is electrically connected to the second electrode 132.

The second electrode 132 may extend to overlap the first semiconductor region A1 having a conductive type different from, e.g., opposite to, that of the second electrode 132. As such, the second electrode 132 may extend beyond the second semiconductor region A2 having the same conductive type as that of the second electrode 132, and may be formed to overlap the first and second semiconductor regions A1 and A2. Accordingly, the interlayer insulating layer 150 may be disposed between the second electrode 132 and the first semiconductor structure 110 having different conductive types to, e.g., reduce the possibility of and/or prevent an electrical circuit short therebetween. For example, the interlayer insulating layer 150 may separate the first and second semiconductor structures 110 and 120 from each other and may separate the first semiconductor structure 110 from the second electrode 132.

According to an exemplary embodiment, the first and second semiconductor structures 110 and 120 may be designed to have different areas to, e.g., increase collection efficiency of carriers, and the first and second electrodes 131 and 132 may be designed to have equal areas to, e.g., reduce a serial resistance. The second electrode 132 may not be limited to the second semiconductor region A2 of the relatively narrow area and may extend to the first semiconductor region A1 having a conductive type opposite to that of the second semiconductor region A2 and the area of the second electrode 132 and the area of the first electrode 131 may be uniform.

The interlayer insulating layer 150 may extend between the second electrode 132 and the first semiconductor structure 110. The interlayer insulating layer 150 may be formed in a region where the second electrode 132 and the first semiconductor structure 110 overlap since the second electrode 132 extends to the first semiconductor region A1 having a conductive type opposite to that of the second electrode 132. The interlayer insulating layer 150 may reduce the possibility of and/or prevent an electrical circuit short between the second electrode 132 and the first semiconductor structure 110.

Referring to FIG. 2, the interlayer insulating layer 150 may be formed on a part of the first semiconductor structure 110, e.g., on the first semiconductor structure 110 that overlaps the second electrode 132. The interlayer insulating layer 150 may be integrally formed on the second semiconductor structure 120 and the first semiconductor structure 110. The first electrode 131 may be spaced apart from the interlayer insulating layer 150.

An upper surface of the first electrode 131 may be at a first distance from the substrate 100 and an upper surface of the second electrode 132, which second electrode 132 is on the first interlayer insulating layer 150, may be at a second distance from the substrate 100. The second distance may be greater than the first distance. Accordingly, the upper surface of the first electrode 131 and the upper surface of the second electrode 132 may not be coplanar. The interlayer insulating structure 150 and the first electrode 131 may be arranged along a single horizontal line, which horizontal line passes through both the interlayer insulating structure 150 and the first electrode 131. The horizontal line may extend in a direction that extends between the interlayer insulating structure and the first electrode, e.g., in the x-axis direction. A placement of the first electrode 131 and the second electrode 132 may be offset in a direction perpendicular to the semiconductor substrate 100.

The interlayer insulating layer 150 may have a sufficient thickness in such a way that the first and second semiconductor structures 110 and 120 may be planarized after burying the interlayer insulating layer 150 between the first and second semiconductor structures 110 and 120. The second electrode 132 may be formed on the planar surface of the interlayer insulating layer 150. The interlayer insulating layer 150 may contact, e.g., be directly under, the second electrode 132.

The interlayer insulating layer 150 may have the via hole 150'. The second electrode 132 and the second semiconductor structure 120 may be stably connected to each other through and/or in the via hole 150'. For example, the second electrode 132 may have a protrusion 132a that is disposed within the via hole 150'. The protrusion 132a of the second electrode 132 may be on, e.g., in contact with, the second semiconductor structure 120.

A gap insulating layer 160 may correspond to a bottom surface of the via hole 150', e.g., the gap insulating layer 160 may be on the second semiconductor region A2 and may be exposed by the via hole 150'. The gap insulating layer 160 may cover an area between the first semiconductor region A1 and the second semiconductor region A2. The gap insulating layer 160 may passivate the surface of the semiconductor substrate 100 exposed between the first and second semiconductor regions A1 and A2. The gap insulating layer 160 may insulate the first and second semiconductor regions A1 and A2 from each other. For example, the gap insulating layer 160 may include an oxide layer (SiOx) and/or a nitride layer (SiNx).

According to an exemplary embodiment, the gap insulating layer 160 may include the nitride layer may have a negative fixed charge and may reduce surface recombination loss of carriers. For example, the gap insulating layer 160 may reduce the possibility of and/or prevent electrons from moving to the surface of the semiconductor substrate 100 in which the gap insulating layer 160 is formed.

Figure 4:
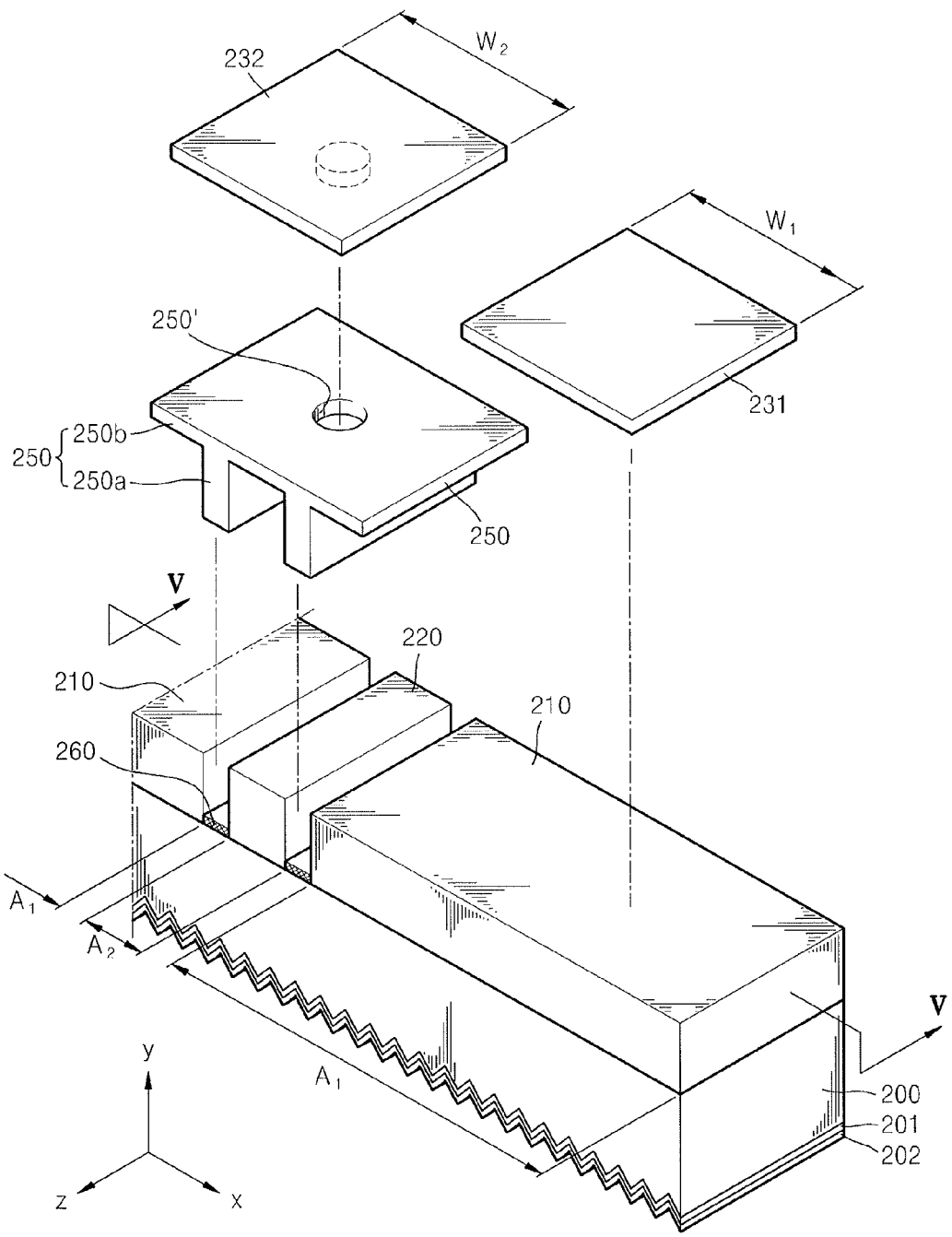
FIG. 4 illustrates a schematic perspective view of a photoelectric device according to an exemplary embodiment.
Figure 5:
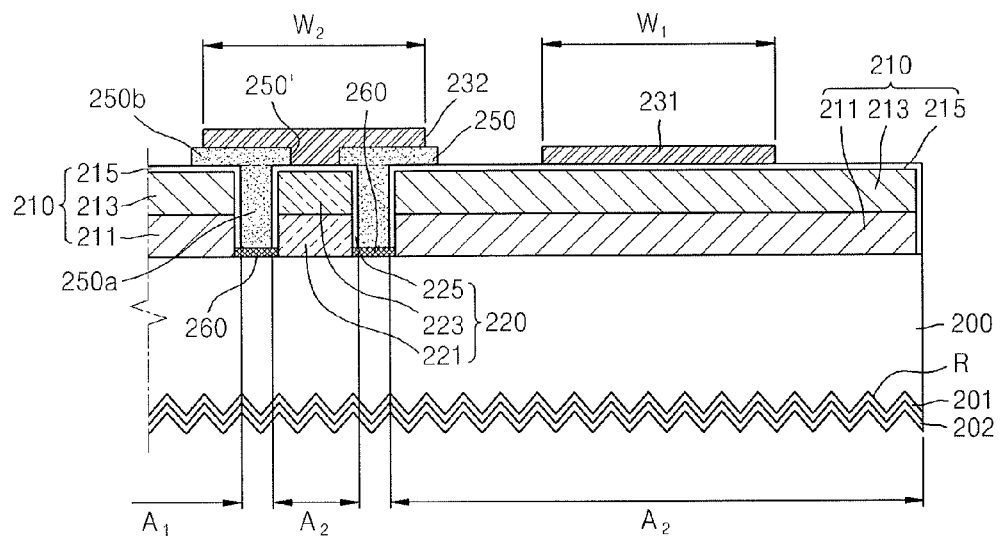
FIG. 5 illustrates a cross-sectional view of the photoelectric device taken along a line V-V of FIG. 4.

FIG. 4 illustrates a schematic perspective view of a photoelectric device according to another exemplary embodiment. The photoelectric device of this exemplary embodiment may be similar to that of the above exemplary embodiment, except sizes and/or shapes of elements may be varied. FIG. 5 illustrates a cross-sectional view of the photoelectric device taken from a line V-V of FIG. 4.

Referring to FIGS. 4 and 5, the photoelectric device may include a semiconductor substrate 200, a first semiconductor structure 210 having a first conductivity type, and a second semiconductor structure 220 having a second conductivity type formed on the semiconductor substrate 200. The first conductive type may be different from, e.g., opposite of, the second conductivity type. First and second electrodes 231 and 232 may be formed on the first and second semiconductor structures 210 and 220, respectively. The first electrode 231 may be electrically connected to the first semiconductor structure 210 and the second electrode 232 may be electrically connected to the second semiconductor structure 220. An interlayer insulating layer 250 may be disposed between the second electrode 232 and the first semiconductor structure 210 and between the first semiconductor structure 210 and the second semiconductor structure 220.

The first semiconductor structure 210, the second semiconductor structure 220, and interlayer insulating layer 250 may be substantially the same as or similar to the first semiconductor structure 110, the second semiconductor structure 120, and the interlayer insulating layer 150, respectively, except they may differ by size and/or shape. The first and second electrodes 231 and 232 may be substantially the same as the first and second electrodes 131 and 132.

Reference numerals A1 and A2 denote first and second semiconductor regions in which the first and second semiconductor structures 210 and 220 are projected on the semiconductor substrate 200. However, A1 and A2 may be used to indicate widths of the first and second semiconductor structures 210 and 220.

The first and second semiconductor structures 210 and 220 may be alternately arranged on the semiconductor substrate 200. For example, the second semiconductor structure 220 may have an island shape that is between two adjacent first semiconductor structures 210. FIGS. 4 and 5 illustrate a part of a plurality of alternately formed first and second semiconductor structures 210 and 220. For example, the first semiconductor structures 210 may be disposed at opposing sides of the second semiconductor structures 220. The first semiconductor structures 210 disposed at the opposing side of the second semiconductor structures 220 may have substantially the same structure and may be spaced apart from each other.

The first semiconductor structure 210 may be formed over a relatively wide region, e.g., so as to have a greater area than the second semiconductor structure 220, and may extend in parallel to the second semiconductor structure 220 in a line shape in one direction, e.g., in the z-axis direction. For example, lengths of the first and semiconductor structures 210 and 220 may be the same in the z-axis direction and the length of the first semiconductor structure 210 in the x-axis direction may be greater than that of the second semiconductor structure 220. The first and second semiconductor structures 210 and 220 having opposite conductivity types may be spatially spaced and electrically insulated from each other. For example, the interlayer insulating layer 250 may be arranged between the first and second semiconductor structures 210 and 220 to, e.g., provide insulation.

The interlayer insulating layer 250 may reduce the possibility of and/or prevent an electrical short circuit between the first semiconductor structure 210 and the second electrode 232 connected to the second semiconductor structure 220 having a conductive type opposite to that of the first semiconductor structure 210. For example, the interlayer insulating layer 250 may be formed over the adjacent first semiconductor structures 210 disposed at opposing sides of the second semiconductor structures 220. The interlayer insulating layer 250 may support the second electrode 232 and may insulate the second electrode 232 from the first semiconductor structures 210 disposed at opposing sides of the second semiconductor structures 220.

The interlayer insulating layer 250 may include a first portion 250a and a second portion 250b. The first portion 250a may extend in one direction, e.g., in the y-axis direction, between the first and second semiconductor structures 210 and 220. For example, the first portion 250a may be buried between the first and second semiconductor structures 210 and 220. The second portion 250b may extend in another direction, e.g., in the z-axis direction, so as to overlap the first portion 250a and to overlap an upper surface of at least the first semiconductor structure 210. The second portion 250b may include a via hole 250', e.g., a through hole, that overlaps an upper surface of the second semiconductor structure 220.

The first and second semiconductor structures 210 and 220 may form an emitter and a base that separate and collect carriers generated by light. The first and second semiconductor structures 210 and 220 may extend in parallel and may have different widths A1 and A2, respectively. For example, the first semiconductor structure 210 may extend in parallel to the second semiconductor structure 220 extending in one direction, e.g., the z-axis direction. The width A1 of the first semiconductor structure 210 and the width A2 of the second semiconductor structure 220 may be designed to be different from each other. As such, collection efficiency of carriers may be increased. The first semiconductor structure 210 that collects minority carriers from the semiconductor substrate 200 may have a relatively great width A1, and the second semiconductor structure 220 that collects majority carriers from the semiconductor substrate 200 may have a relatively small width A2.

The first and second electrodes 231 and 232 may be formed on the first and second semiconductor structures 210 and 220, respectively, to, e.g., withdraw collected carriers to the outside. The first second electrodes 231 and 232 have wide shapes in a width direction, e.g., the x-axis direction, in FIG. 4 for understanding convenience, and embodiments are not limited thereto. For example, the first and second electrodes 231 and 232 may be formed in a stripe pattern in a current withdrawal direction, e.g., the z-axis direction. To reduce a serial resistance, the first and second electrodes 231 and 232 may have equal areas to be uniform, and, e.g., the line widths W1 and W2 may be substantially the same.

The second electrode 232 may extend to the first semiconductor region A1 having a conductive type opposite to that of the second electrode 232 beyond the second semiconductor region A2 having the same conductive type as that of the second electrode 232. For example, the second electrode 232 may extend to the first semiconductor region A1 in both opposing sides thereof. The line width W2 of the second electrode 232 may be greater than the width A2 of the second semiconductor structure 220 electrically connected to the second electrode 232. The line width W2 of the second electrode 232 may be uniform with the line width W1 of the first electrode 231, and, e.g., a serial resistance may be reduced.

Referring to FIG. 5, the first semiconductor structure 210 may include a first intrinsic semiconductor layer 211, a first conductive semiconductor layer 213, and a first transparent conductive layer 215. However, the first intrinsic semiconductor layer 211 and/or the first transparent conductive layer 215 may be omitted according to a detailed structure.

The second semiconductor structure 220 may include a second intrinsic semiconductor layer 221, a second conductive semiconductor layer 223, and a second transparent conductive layer 225. However, the second intrinsic semiconductor layer 221 and/or the second transparent conductive layer 225 may be omitted according to a detailed structure.

The interlayer insulating layer 250 may be formed between the second electrode 232 and the first semiconductor structure 210 to, e.g., insulate the second electrode 232 and the first semiconductor structure 210 from each other. The interlayer insulating layer 250 may also extend between the adjacent first semiconductor structures 210 and the second semiconductor structure 220. The interlayer insulating layer 250 may be formed on a part of the first semiconductor structure 210. For example, the interlayer insulating layer 250 may be formed on the first semiconductor structure 210 that overlaps the second electrode 232. The interlayer insulating layer 250 may be formed over the first semiconductor structure 210 in both sides thereof, and may be integrally formed on the second semiconductor structure 220.

The interlayer insulating layer 250 may have a sufficient thickness in such a way that the first and second semiconductor structures 210 and 220 may be planarized by being burying between the first and second semiconductor structures 210 and 220. The second electrode 232 may be stably formed on the planar surface of the interlayer insulating layer 250. The interlayer insulating layer 250 may contact the second electrode 232 and the second semiconductor structure 220 through the via hole 250'. For example, a protrusion of the second electrode 232 may be disposed in the via hole 250' to contact the second semiconductor structure 220.

A gap insulating layer 260 may be formed between the first semiconductor region A1 and the second semiconductor region A2. The gap insulating layer 260 may, e.g., passivate the surface of the semiconductor substrate 200 exposed between the first and second semiconductor regions A1 and A2. The gap insulating layer 260 may be formed to, e.g., insulate the first and second semiconductor regions A1 and A2 from each other. For example, the gap insulating layer 260 may include an oxide layer (SiOx) and/or a nitride layer (SiNx).

Reference numerals 201 and 202 that are not described in FIG. 5 denote a passivation layer and an antireflective layer, respectively, formed in a light receiving surface of the semiconductor substrate 200. The passivation layer 201 and the antireflective layer 202 may be formed on a texture structure R formed as a roughness pattern on a surface of the semiconductor substrate 200.

According to exemplary embodiments, the first semiconductor structure 110 may be formed having a large area surrounding the second semiconductor structure 120 having an isolation type such as a dot or an island (FIG. 1) or may extend having a great width in parallel to the second semiconductor structure 220 having a relatively small width (FIG. 4), e.g., to increase collection efficiency of carriers. However, embodiments are not limited thereto. For example, if the electrodes 131, 132, 231, and 232 of an emitter or a base extend to conductive types opposite to those of the electrodes 131, 132, 231, and 232 beyond conductive types of the electrodes 131, 132, 231, and 232, e.g., the electrodes 131, 132, 231, and 232 may extend wider than the semiconductor regions A1 and A2 having the same conductive types as those of the electrodes 131, 132, 231, and 232 to, e.g., reduce a serial resistance. Further, the interlayer insulating layers 150 and 250 may be disposed to reduce the possibility of and/or prevent an electrical circuit short between the electrodes 131, 132, 231, and 232 and the semiconductor regions A1 and A2 having opposite conductive types. In this regard, embodiments include a variety of configurations other than those described above.

A method of manufacturing a photoelectric device according to an exemplary embodiment will now be described with reference to FIGS. 6A through 6V.

Figure 6A:
FIGS. 6A through 6V illustrate sequential cross-sectional views depicting stages in a method of manufacturing a photoelectric device, according to an exemplary embodiment.

Referring to FIG. 6A, a semiconductor substrate 300 may be prepared. For example, the semiconductor substrate 300 may be formed as an n-type crystalline silicon wafer. A cleaning process may be performed by using, e.g., an acidic or alkaline solution, to remove physical and/or chemical impurities from a surface of the semiconductor substrate 300.

Figure 6B:
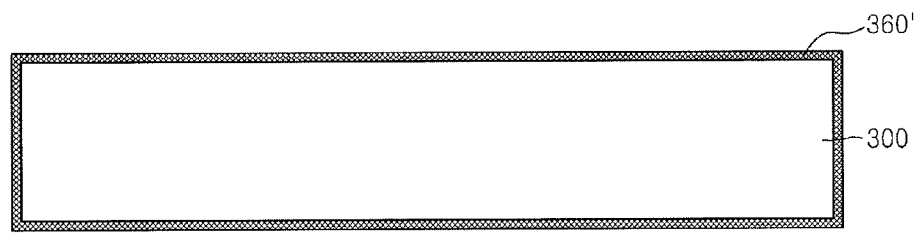

Referring to FIG. 6B, an insulating layer 360' may be formed on the semiconductor substrate 300 (FIG. 6B). The insulating layer 360' may be an etching mask during a texturing process of forming a roughness pattern in the surface of the semiconductor substrate 300. The insulating layer 360' may be formed of a material that is resistant to a texturing etchant. A remnant of the insulating layer 360' may cover between the first semiconductor region A1 and the second semiconductor region A2, passivate the surface of the semiconductor substrate 300 exposed between the first semiconductor region A1 and the second semiconductor region A2, and insulate the first semiconductor region A1 and the second semiconductor region A2 from each other, by way of patterning that will be described later.

For example, the insulating layer 360' may include an oxide layer (SiOx) and/or a nitride layer (SiNx). For example, insulating layer 360' may be a combination layer of the oxide layer (SiOx) and the nitride layer (SiNx). The insulating layer 360' may be formed by, e.g., growing the oxide layer (SiOx) by thermal oxidation or depositing the oxide layer (SiOx) or the nitride layer (SiNx) by using a chemical vapor deposition (CVD) method.

Figure 6C:
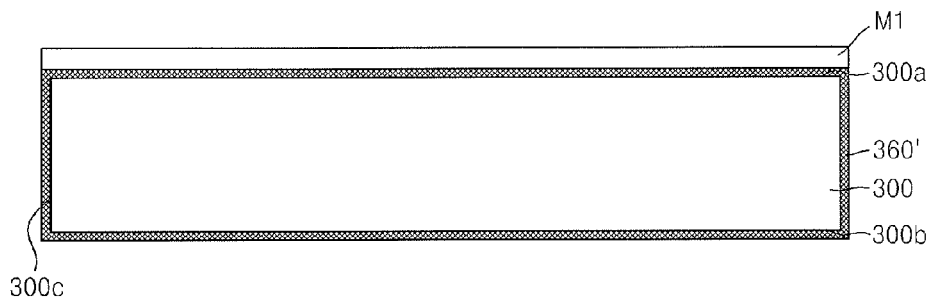
Figure 6D:
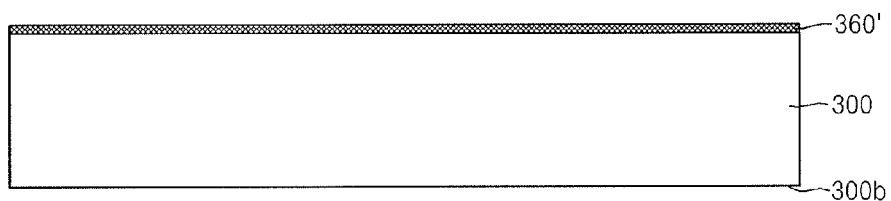

Referring to FIGS. 6C and 6D, an anti-etching layer M1 may be formed on a partial region of the insulating layer 360', and etching may be performed on the insulating layer 360'. The anti-etching layer M1 may be formed to cover a first surface 300a of the semiconductor substrate 300 and to remove a second surface 300b of the semiconductor substrate 300 and the insulating layer 360' of side surfaces thereof. For example, an acidic solution such as hydrofluoric acid (HF), phosphoric acid ($H_3PO_4$), etc. having etching characteristics with respect to the insulating layer 360' may be used as the etchant. If etching is sufficiently and/or completely performed, the anti-etching layer M1 may be removed.

Figure 6E:
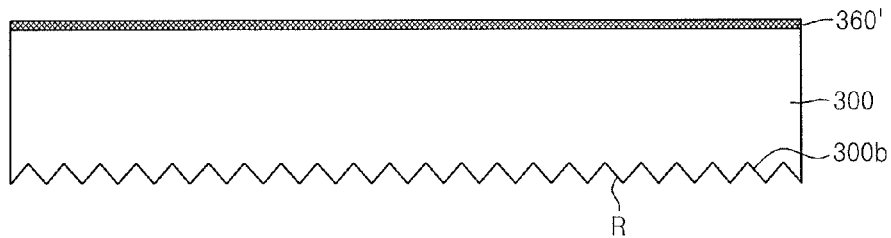

Referring to FIG. 6E, texturing may be performed on the second surface 300b of the semiconductor substrate 300. Etching may be performed on the second surface 300b of the semiconductor substrate 300 by using, e.g., the insulating layer 360' formed on the semiconductor substrate 300 as an etching mask. For example, a texture structure R of the roughness pattern may be formed on the surface of the semiconductor substrate 300 by using an alkaline solution such as KOH, NaOH, etc. and performing anisotropic etching with respect to the semiconductor substrate 300.

Figure 6F:
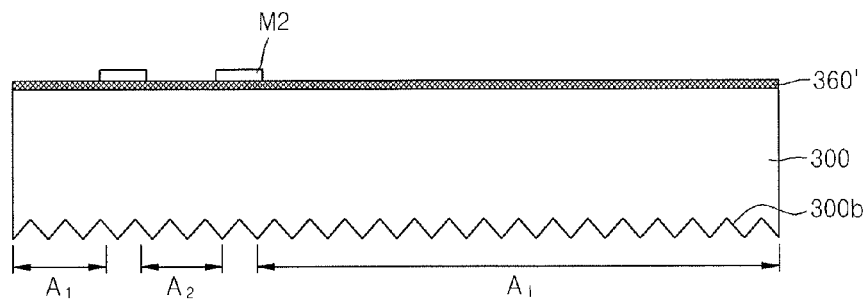
Figure 6G:
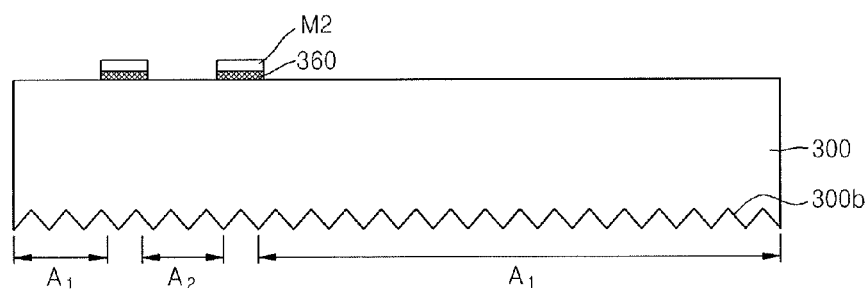
Figure 6H:
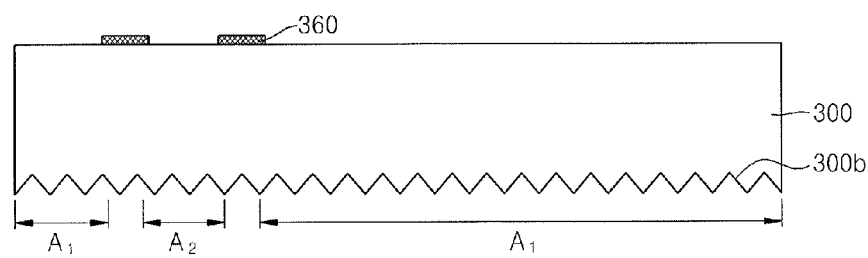

Referring to FIGS. 6F-6H, a gap insulating layer 360 may be formed by patterning the insulating layer 360'. For example, the gap insulating layer 360 is formed by removing portions of the insulating layer 360' while portions between the first and second semiconductor regions A1 and A2 may remain. For example, an anti-etching layer M2 may be formed on a partial region of the insulating layer 360', an etchant may be applied thereto, and the insulating layer 360' excluding the partial region protected by the anti-etching layer M2 may be etched and removed. An acidic solution such as hydrofluoric acid (HF), phosphoric acid ($H_3PO_4$), etc. having etching characteristics with respect to the insulating layer 360' may be used as the etchant. If etching is sufficiently and/or completely performed, the anti-etching layer M2 may be removed.

Figure 6I:
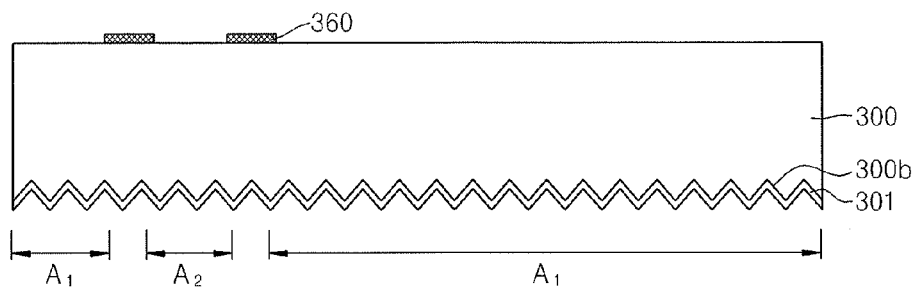

Referring to FIG. 6I, a passivation layer 301 may be formed on the second surface 300b of the semiconductor substrate 300. Before the passivation layer 301 is formed, the semiconductor substrate 300 may be cleaned for, e.g., effective passivation. The passivation layer 301 may be formed on the textured second surface 300b of the semiconductor substrate 300. The passivation layer 301 may, e.g., suppress recombination of carriers generated by the semiconductor substrate 300 and enhance collection efficiency of carriers.

For example, the passivation layer 301 may be formed of intrinsic amorphous silicon or doped amorphous silicon. For example, the passivation layer 301 may be doped with the same conductive type as that of the semiconductor substrate 300. For example, the passivation layer 301 may be formed as a heavily doped n+ layer on the surface of the n-type semiconductor substrate 300, and may form a front surface field (FSF) to reduce the surface recombination loss. However, embodiments are not limited thereto, e.g., the passivation layer 301 may include a silicon oxide layer and a silicon nitride layer.

The passivation layer 301 may be formed by using a CVD method, e.g., a CVD method using silane ($SiH_4$) that is a silicon containing gas. The passivation layer 301 may be formed on the second surface 300b (a light receiving surface) of the semiconductor substrate 300, and a band gap may be adjusted to change light absorption. For example, an additive may be added to the passivation layer 301 to increase the band gap, and thus light absorption may be changed, and incident light may be absorbed into the semiconductor substrate 300.

Figure 6J:
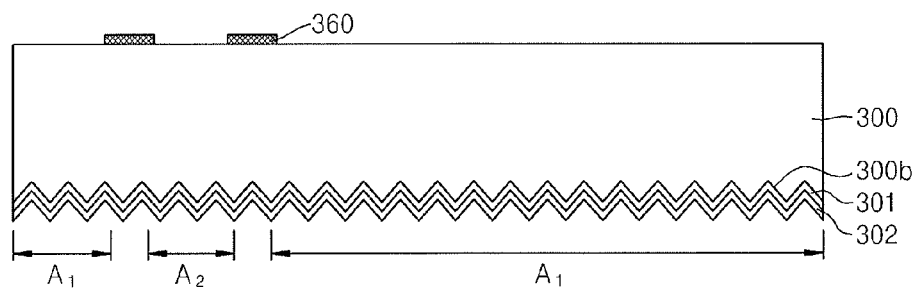

Referring to FIG. 6J, an antireflective layer 302 may be formed on the passivation layer 301. The antireflective layer 302 may include a silicon oxide layer and/or a silicon nitride layer. For example, the antireflective layer 302 may be formed as a single layer of the silicon oxide layer or a combination layer of the silicon oxide layer and the silicon nitride layer having different refractive indexes.

Although the passivation layer 301 and the antireflective layer 302 have separate layer structures according to an exemplary embodiment, the passivation layer 301 and the antireflective layer 302 have structures of a single layer according to another exemplary embodiment. For example, a hydrogenated silicon nitride (SiN:H) layer may be formed to obtain passivation and antireflection effects.

Figure 6K:
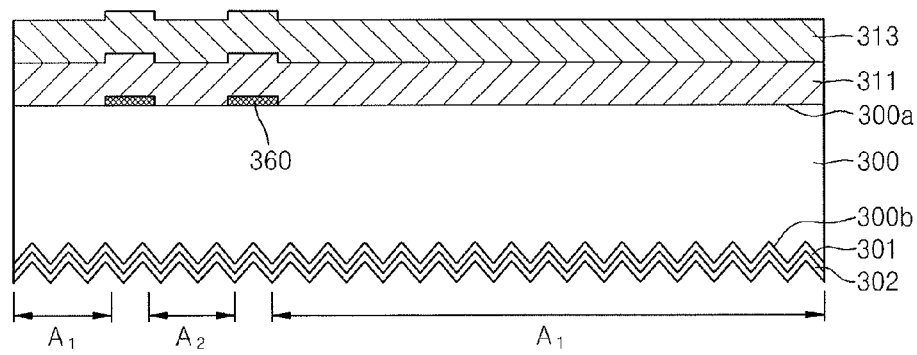

Referring to FIG. 6K, a first intrinsic semiconductor layer 311 may be formed on the first surface 300a of the semiconductor substrate 300. For example, the first intrinsic semiconductor layer 311 may be formed by using a CVD method using silane ($SiH_4$) that is the silicon containing gas, and may be formed of amorphous silicon.

Then, a first conductive semiconductor layer 313 may be formed on the first intrinsic semiconductor layer 311. For example, the first conductive semiconductor layer 313 may be doped in a p-type that is a conductive type inverse to that of the semiconductor substrate 300. The first conductive semiconductor layer 313 may be formed by using, e.g., a CVD method using a doped gas (e.g. $B_2H_6$) and silane ($SiH_4$) as sources, and may be formed of amorphous silicon.

Figure 6L:
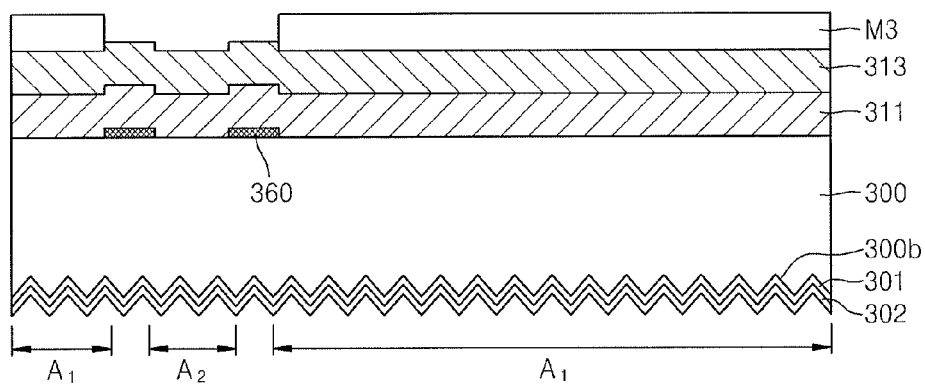
Figure 6M:
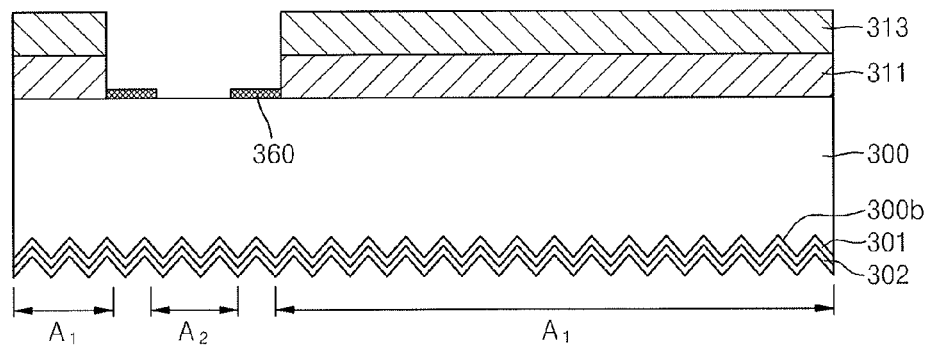

Referring to FIGS. 6L and 6M, the first intrinsic semiconductor layer 311 and the first conductive semiconductor layer 313 formed on the front surface of the semiconductor substrate 300 may be patterned. For example, the first intrinsic semiconductor layer 311 and the first conductive semiconductor layer 313 that are formed on the second semiconductor region A2 and the gap insulating layer 360 may be removed. However, in consideration of a processing margin, the first intrinsic semiconductor layer 311 and the first conductive semiconductor layer 313 may be formed on a part of the gap insulating layer 360 to, e.g., reduce recombination loss due to a defective of the surface of the exposed semiconductor substrate 300 if there is a gap between the gap insulating layer 360 and the first semiconductor region A1.

With regard to a more detailed patterning process, an etching mask M3 may be applied onto the first conductive semiconductor layer 313. An exposed part may be removed through the etching mask M3 and an acidic solution may be used as an etchant, e.g., a mixing solution of nitride acid ($HNO_3$), hydrofluoric acid (HF), and/or acetic acid ($CH_3COOH$ or DI water). If etching is sufficiently and/or completely performed, the etching mask M3 may be removed.

Through the patterning process above, the first intrinsic semiconductor layer 311 and the first conductive semiconductor layer 313 may be formed on the first semiconductor region A1, and the first semiconductor region A1 may have a relatively wider area than an area of the second semiconductor region A2. For example, the first semiconductor region A1 of an emitter that collects minority carriers may be relatively wider than the second semiconductor region A2, thereby increasing collection efficiency of carriers. For example, the first semiconductor region A1 may surround the second semiconductor region A2 having an isolation type such as a dot or an island. According to another exemplary embodiment, the first semiconductor region A1 may extend in a uniform width and may have a greater width than the width of the second semiconductor region A2 as shown in FIG. 4.

Figure 6N:
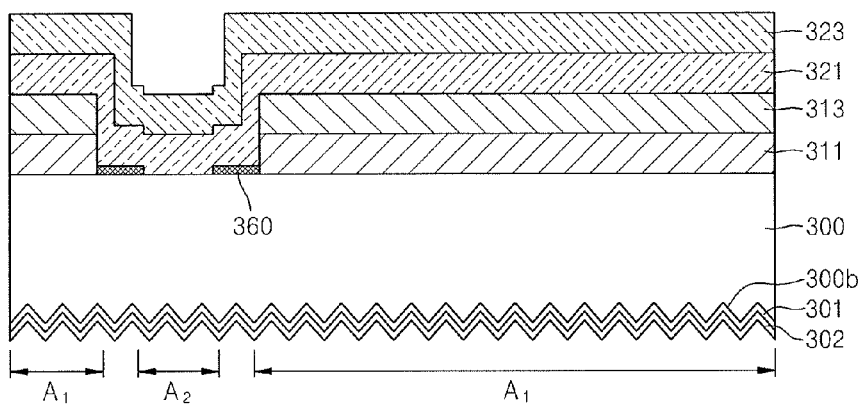

Referring to FIG. 6N, a second intrinsic semiconductor layer 321 may be formed on the semiconductor substrate 300. For example, the second intrinsic semiconductor layer 321 may be formed by using a CVD method using silane ($SiH_4$) that is the silicon containing gas and may be formed of amorphous silicon.

Then, a second conductive semiconductor layer 323 may be formed on the second intrinsic semiconductor layer 321 (FIG. 6N). For example, the second conductive semiconductor layer 323 may be doped in an n-type that is the same conductive type as that of the semiconductor substrate 300. For example, the second conductive semiconductor layer 323 may be formed by using a CVD method using a doped gas (e.g. $B_2H_6$) and silane ($SiH_4$) as sources, and may be formed of amorphous silicon.

Figure 6O:
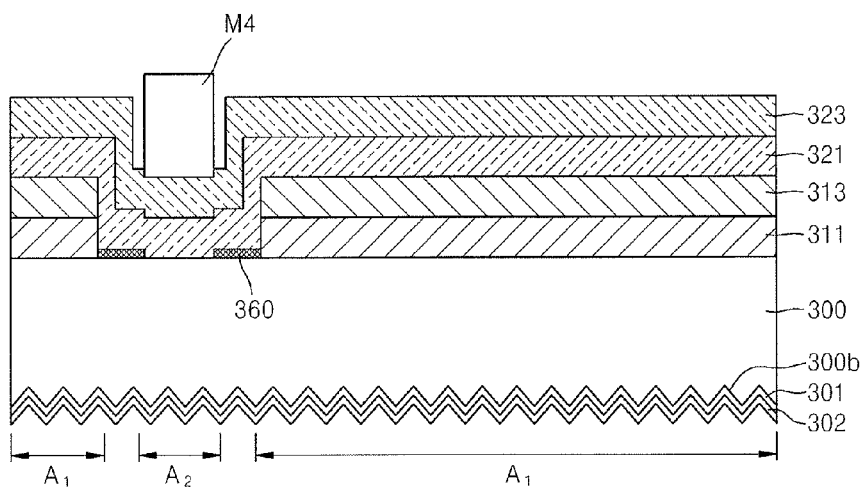
Figure 6P:
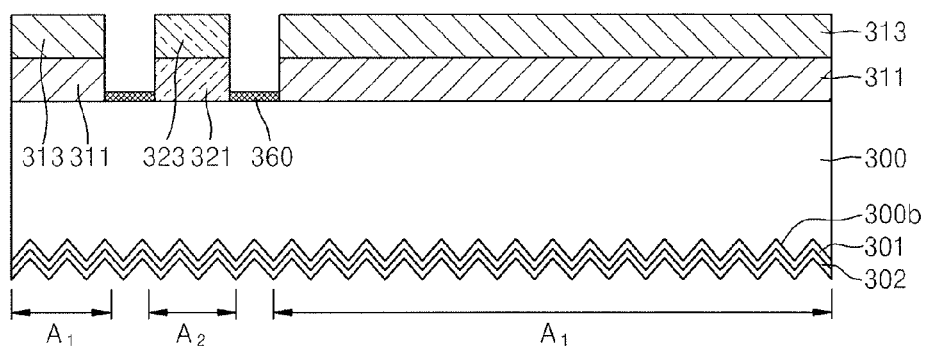

Referring to FIGS. 6O and 6P, the second intrinsic semiconductor layer 321 and the second conductive semiconductor layer 323 formed on the front surface of the semiconductor substrate 300 are patterned. For example, the second intrinsic semiconductor layer 321 and the second conductive semiconductor layer 323 that are formed on the first semiconductor region A1 and the gap insulating layer 360 may be removed. However, in consideration of a processing margin, the second intrinsic semiconductor layer 321 and the second conductive semiconductor layer 323 may be formed on a part of the gap insulating layer 360 to, e.g., reduce recombination loss due to a defective of the surface of the exposed semiconductor substrate 300 if there is a gap between the gap insulating layer 360 and the second semiconductor region A2.

With regard to a more detailed patterning process, an etching mask M4 may be applied onto the second conductive semiconductor layer 323, and an exposed part may be removed through the etching mask M4. An acidic solution may be used as an etchant, e.g., a mixing solution of nitride acid ($HNO_3$), hydrofluoric acid (HF), and acetic acid ($CH_3COOH$ or DI water). If etching is sufficiently and/or completely performed, the etching mask M4 may be removed.

Through the patterning process above, the second intrinsic semiconductor layer 321 and the second conductive semiconductor layer 323 may be formed on the second semiconductor region A2, and the second semiconductor region A2 may have a relatively narrower area than the area of the first semiconductor region A1. For example, the second semiconductor region A2 may have an isolation type such as a dot or an island. According to another exemplary embodiment, the second semiconductor region A2 may extend in a width narrower than the width of the first semiconductor region A1, e.g., as shown in FIG. 4.

Figure 6Q:
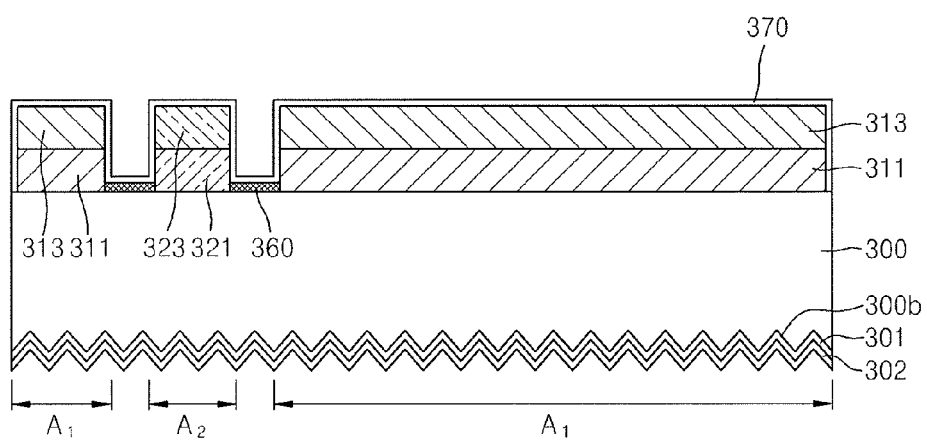

Referring to FIG. 6Q, a transparent conductive layer 370 may be formed on the first and second conductive semiconductor layers 313 and 323. For example, the transparent conductive layer 370 may be formed along the external surfaces of the first and second intrinsic semiconductor layers 311 and 321 and the external surfaces of the first and second semiconductor layers 313 and 323. The transparent conductive layer 370 may cover, e.g., completely cover, the external surfaces. The transparent conductive layer 370 may be formed of transparent conducting oxide (TCO) such as indium tin oxide (ITO), zinc oxide (ZnO), etc., and may be formed by using a sputtering or CVD method, etc.

Figure 6R:
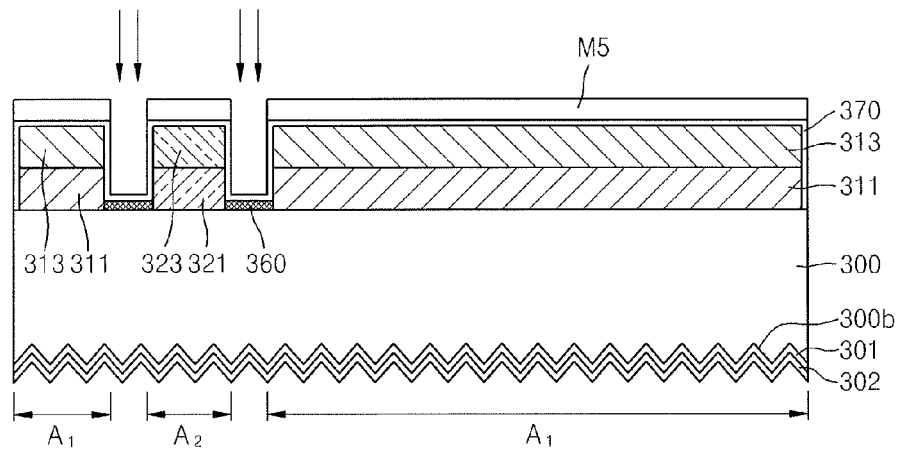
Figure 6S:
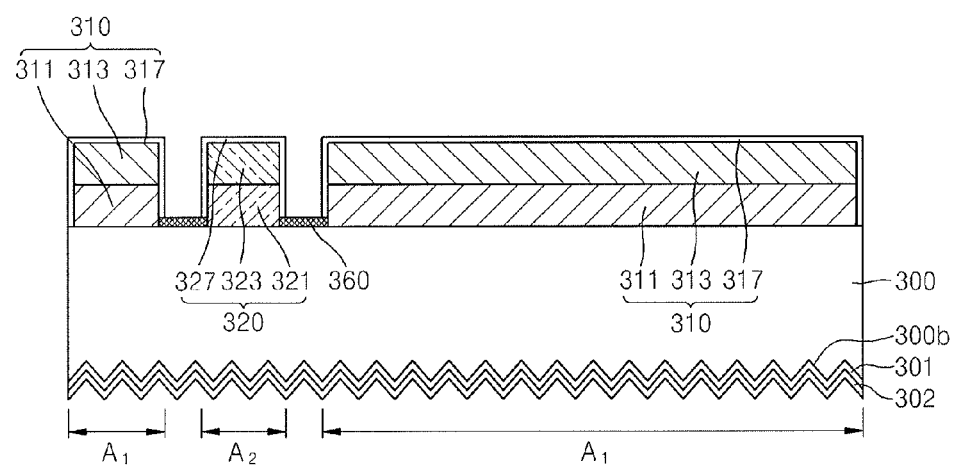

Referring to FIGS. 6R and 6S, the transparent conductive layer 370 formed on the overall surface of the semiconductor substrate 300 is separated. For example, the transparent conductive layer 370 may be separated into a first transparent conductive layer 317 on the first conductive semiconductor layer 313 and a second transparent conductive layer 327 on the second conductive semiconductor layer 323. The transparent conductive layer 370 may be formed over the exposed surfaces of the semiconductor substrate 300 through the process described above.

The transparent conductive layer 370 on the gap insulating layer 360 may be removed to, e.g., reduce the possibility of and/or prevent an electrical circuit short between the first and second conductive semiconductor layers 313 and 323. For example, an etching mask M5 may be applied onto the transparent conductive layer 370, and the transparent conductive layer 370 exposed through the etching mask M5 may be removed.

According to an exemplary embodiment, an etchant that selectively exhibits etching characteristic with respect to the transparent conductive layer 370 and the gap insulating layer 360 may be used. The gap insulating layer 360 may remain after the transparent conductive layer 370 is etched and removed. Through the preceding processes, the first and second semiconductor structures 310 and 320 may be formed on the first and second semiconductor regions A1 and A2 on the semiconductor substrate 300.

Figure 6T:
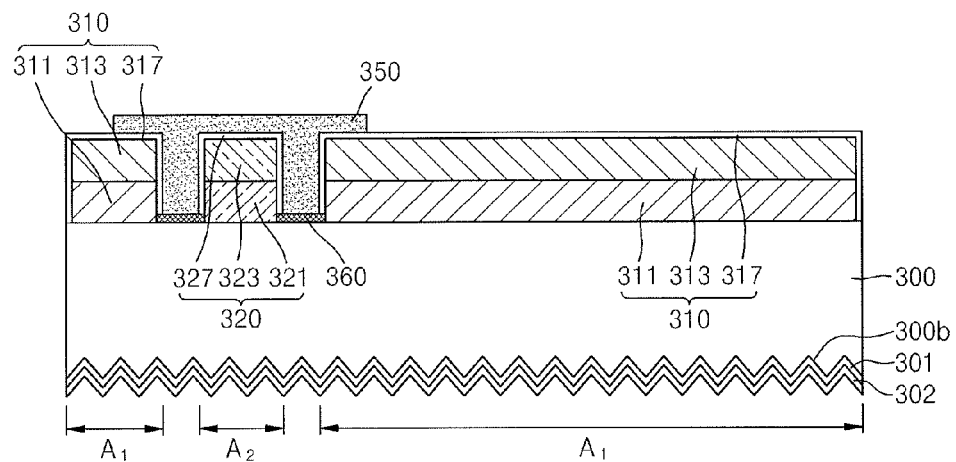

Referring to FIG. 6T, an interlayer insulating layer 350 may be formed over at least a part of the first semiconductor structure 310. For example, the interlayer insulating layer 350 may be formed in a region in which a second electrode 332 is to be later formed. The interlayer insulating layer 350 may be formed to insulate the second electrode 332 formed over and/or adjacent to the first and second semiconductor structures 310 and 320 and the first semiconductor structure 310 having a different conductive type from the second electrode 332 each other. The interlayer insulating layer 350 may be integrally formed over the second semiconductor structure as well as the first semiconductor structure 310.

For example, the interlayer insulating layer 350 may include and/or be formed of any electrically insulating material or any combination of electrically insulating materials. For example, the interlayer insulating layer 350 may be formed as the silicon oxide layer (SiOx) and/or the silicon nitride layer (SiNx) and by using a CVD method.

The interlayer insulating layer 350 may be formed over a part of the first semiconductor structure 310 and the second semiconductor structure 320. The interlayer insulating layer 350 may have a sufficient thickness in such a way that the first and second semiconductor structures 310 and 320 may be planarized by burying between the first and second semiconductor structures 310 and 320. The second electrode 332 may be formed on the planar surface of the interlayer insulating layer 350 as will be described later.

Figure 6U:
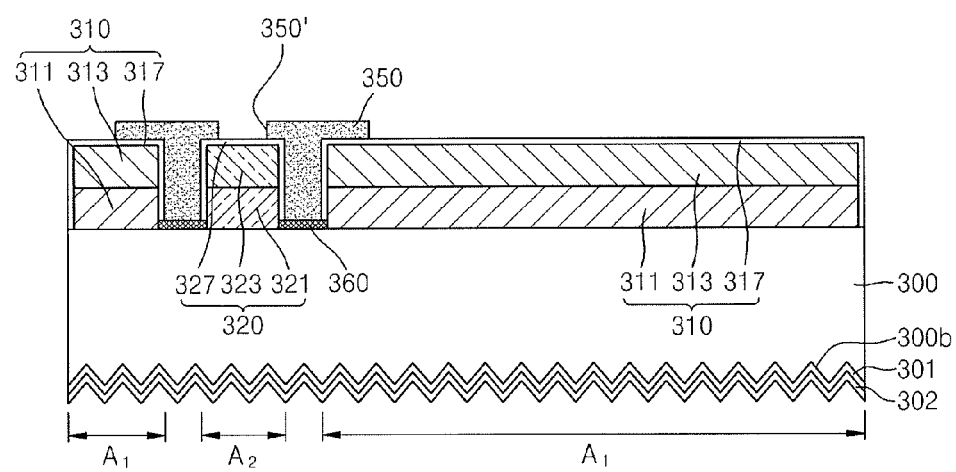

Referring to FIG. 6U, a via hole 350' may be formed in the interlayer insulating layer 350. For example, the via hole 350' may be formed in the interlayer insulating layer 350 that covers the second semiconductor structure 320 and may expose at least a portion of an upper surface of the second semiconductor structure 320. The via hole 350' may be formed to electrically connect the second semiconductor structure 320 to the second electrode 332. Although not shown, the via hole 350' my be formed by forming an etching mask (not shown) on the interlayer insulating layer 350, and etching and removing the interlayer insulating layer 350 exposed through the etching mask (not shown).

Figure 6V:
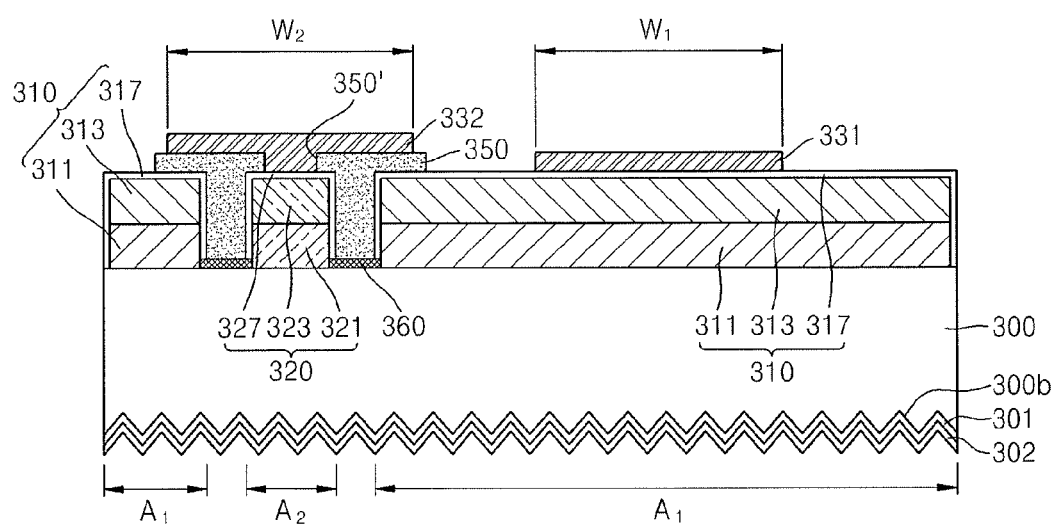

Referring to FIG. 6V, the first and second electrodes 331 and 332 may be formed on the first and second semiconductor structures 310 and 320. The first and second electrodes 331 and 332 may be connected to the first and second semiconductor structures 331 and 332, respectively, and thus carriers may be withdrawn to the outside. The first and second electrodes 331 and 332 may be formed of, e.g., a metallic material such as silver (Ag), aluminum (Al), copper (Cu), nickel (Ni), etc. For example, the first and second electrodes 331 and 332 may be formed by thermal firing after pattern-printing a metal paste (not shown) by screen-printing.

The first and second electrodes 331 and 332 may be uniformly formed having equal areas. For example, the first and second electrodes 331 and 332 may be formed substantially in the same line widths W1 and W2 to, e.g., reduce a serial resistance of photocurrent by designing uniform areas of the first and second electrodes 331 and 332. For example, the first electrode 331 may be formed over a part of the first semiconductor structure 310, the second electrode 332 may be formed over a part of the first semiconductor structure 310 as well as the second semiconductor structure 320, and thus the area of second electrode 332 that expands may be uniform with the area of the first electrode 331.

With regard to locations of the first and second electrodes 331 and 332, the first electrode 331 may be formed on a part of the first semiconductor structure 310 excluding the interlayer insulating layer 350, and the second electrode 332 may be formed over a part of the first semiconductor structure 310 in which the interlayer insulating layer 350 is formed and the second semiconductor structure 320. That is, the first electrode 331 may be formed in a part of the first semiconductor region A1 that occupies a relatively wide region, and the second electrode 332 may be formed in another part thereof.

By way of summation and review, power generation efficiency of the solar cells needs to be increased to, e.g., allow for broad application of the solar cells. To increase power generation efficiency of the solar cells, e.g., a light loss and a surface recombination loss may be reduced and a serial resistance of photocurrents generated by solar cells may also be reduced. Embodiments relate to a photoelectric device capable of increasing collection efficiency of a carrier generated by light and capable of reducing a serial resistance of photocurrent paths.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photoelectric device, comprising:
 a first semiconductor structure and a second semiconductor structure on a substrate, the first semiconductor structure including a different conductivity type from the second semiconductor structure;
 a first electrode on the first semiconductor structure and a second electrode on the second semiconductor structure; and
 a single insulating layer integrally formed as one piece and adjacent to the second semiconductor structure, the single insulating layer separating the first semiconductor structure from the second semiconductor structure and separating the first semiconductor structure from the second electrode, wherein the single insulating layer has a first portion and a second portion, the first portion having an inner diameter and an outer diameter, the second portion having a through hole with a diameter smaller than the inner diameter of the first portion, wherein:

the second semiconductor structure has an island shape such that lateral sides of the second semiconductor structure are continuously surrounded by the first portion and the first semiconductor structure.

2. The photoelectric device as claimed in claim 1, wherein the first semiconductor structure has a first region with a first area and the second semiconductor structure has a second region with a second area, the first area of the first region being greater than the second area of the second region.

3. The photoelectric device as claimed in claim 2, wherein the first electrode and the second electrode have substantially a same width.

4. The photoelectric device as claimed in claim 1, wherein the second electrode overlaps the first semiconductor structure and the second semiconductor structure.

5. The photoelectric device as claimed in claim 1, wherein the single insulating layer includes a through hole, the second electrode being connected to the second semiconductor structure via the through hole.

6. The photoelectric device as claimed in claim 1, wherein the single insulating layer includes a first portion, the first portion being between lateral sides of the first semiconductor structure and lateral sides of the second semiconductor structure on the substrate.

7. The photoelectric device as claimed in claim 6, wherein the first portion of the single insulating layer surrounds at least a portion of lateral sides of the second semiconductor structure.

8. The photoelectric device as claimed in claim 6, wherein the first portion of the single insulating layer surrounds entire lateral sides of the second semiconductor structure.

9. The photoelectric device as claimed in claim 6, wherein the single insulating layer includes a second portion on the first semiconductor structure such that the second portion is between the second electrode and the first semiconductor structure.

10. The photoelectric device as claimed in claim 9, wherein the first and second portions of the single insulating layer are integrally formed as one piece.

11. The photoelectric device as claimed in claim 9, wherein a width of the second portion of the single insulating layer along a first direction is greater than a width of the second electrode along the first direction, the first direction being a direction extending between the first and second electrodes.

12. The photoelectric device as claimed in claim 1, further comprising a gap insulating layer, the gap insulating layer surrounding a portion of lateral sides of the second semiconductor structure, and the single insulating layer being on the gap insulating layer.

13. The photoelectric device as claimed in claim 1, wherein an upper surface of the first electrode is at a first distance from the substrate, and an upper surface of the second electrode is at a second distance from the substrate, the second distance being greater than the first distance.

14. The photoelectric device as claimed in claim 1, wherein the single insulating layer and the first electrode are arranged along a horizontal line extending in a direction between the single insulating layer and the first electrode.

15. The photoelectric device as claimed in claim 1, further comprising:

a passivation layer on the substrate, the passivation layer being on a side of the substrate opposite the first and second semiconductor structures; and an antireflection layer on the passivation layer.

16. The photoelectric device as claimed in claim 1, wherein the first semiconductor structure includes a first intrinsic layer on the substrate, a first conductive semiconductor layer on the first intrinsic layer, and a first transparent conductive layer on the first intrinsic layer and the first conductive semiconductor layer.

17. The photoelectric device as claimed in claim 16, wherein the first transparent conductive layer covers lateral sides of the first intrinsic layer and the first conductive semiconductor layer and covers an upper surface of the first conductive semiconductor layer.

18. The photoelectric device as claimed in claim 16, wherein:

the second semiconductor structure includes a second intrinsic layer on the substrate, a second conductive semiconductor layer on the second intrinsic layer, and a second transparent conductive layer on the second intrinsic layer and the second conductive semiconductor layer, and the first conductive semiconductor layer has the different conductivity type from the second conductive semiconductor layer.

19. The photoelectric device as claimed in claim 18, wherein the second transparent conductive layer covers lateral sides of the second intrinsic layer and the second conductive semiconductor layer and covers an upper surface of the second conductive semiconductor layer.

* * * * *